United States Patent [19]
Tanaka et al.

[11] Patent Number: 6,060,960
[45] Date of Patent: *May 9, 2000

[54] DUPLEXER COMPRISING A SAW FILTER DISPOSED ON A MULTI-LAYER SUBSTRATE

[75] Inventors: Koji Tanaka, Shiga-ken; Norio Nakajima, Takatsuki, both of Japan

[73] Assignee: Murata Manufacturing Co., Ltd., Japan

[*] Notice: This patent is subject to a terminal disclaimer.

[21] Appl. No.: 08/895,160

[22] Filed: Jul. 16, 1997

[30] Foreign Application Priority Data

Jul. 17, 1996 [JP] Japan ................................. 8-187422

[51] Int. Cl.$^7$ ................. H01P 1/15; H01P 5/12; H04B 1/48
[52] U.S. Cl. ..................... 333/104; 333/247; 455/83
[58] Field of Search .................... 333/104, 246, 333/247, 262; 370/278, 282; 455/78, 80, 82, 83

[56] References Cited

U.S. PATENT DOCUMENTS

| 5,483,678 | 1/1996 | Abe ................................... 333/246 X |
| 5,783,976 | 7/1998 | Furutani et al. ..................... 333/104 X |

*Primary Examiner*—Paul Gensler
*Attorney, Agent, or Firm*—Ostrolenk, Faber, Gerb & Soffen, LLP

[57] ABSTRACT

A duplexer includes a high-frequency switch, an LC filter serving as a low-pass filter, and an SAW filter serving as a band-pass filter. The high-frequency switch includes diodes, capacitors, and transmission lines. The LC filter includes capacitors and transmission lines. The high-frequency switch and LC filter are built into a multi-layer ceramic substrate, while the diodes of the high-frequency switch and the SAW filter are mounted on the substrate. The substrate is made of a low-temperature-baked ceramic material.

11 Claims, 3 Drawing Sheets

DUPLEXER COMPRISING A SAW FILTER DISPOSED ON A MULTI-LAYER SUBSTRATE

BACKGROUND OF THE INVENTION

1. Field of the Invention

The present invention relates to duplexers for use in a mobile communication transceiver such as an automobile phone or a portable phone.

2. Description of the Related Art

FIG. 5 is a block diagram showing the general components of a duplexer. A duplexer 1 is a composite high-frequency component which protects the transceiver's receiver from transmission power when transmitting and which supplies a received signal to the receiver when receiving, so that the transceiver can use one antenna ANT for both transmitting and receiving. By mounting compact, surface-mount components such as filters F1 and F2 and a switch SW on a highly dense printed circuit board, the duplexer is made compact and lightweight.

It is expected that mobile communication units, typical of which are an automobile phone and a portable phone, including this duplexer 1, will in the future continue to be made more compact and lightweight while being provided with higher functions. To achieve this target, it is inevitable to make the mounted duplexer 1 more compact and lightweight.

Since a conventional duplexer has a discrete filter and a switch mounted on a printed circuit board, however, it is difficult to make the duplexer more compact and lightweight. Especially in a filter, its performance and size are generally trade-offs. The higher the performance of the filter, the larger the dimensions, and therefore, the filter is prevented from being made compact and lightweight. Conversely, when the filter is made compact due to the size limitations of a mobile communication unit on which the duplexer is mounted, its filtering characteristics are insufficient and a compromise must be made on unit performance.

SUMMARY OF THE INVENTION

The present invention is made to solve the foregoing problem. Accordingly, it is a feature of the present invention to provide a duplexer which can be made compact and lightweight by integrating a high-frequency switch and a filter.

The foregoing feature is achieved in the present invention through the provision of a duplexer including: a multi-layer substrate formed by laminating a plurality of dielectric layers; at least one high-frequency switch formed by a diode mounted on the multi-layer substrate and a transmission line and a capacitor built into the multi-layer substrate; and at least one SAW filter mounted on the multi-layer substrate.

In the above duplexer, since the SAW filter is mounted on the multi-layer substrate formed by laminating a plurality of dielectric layers and constituting the high-frequency switch, and integrated, the area required for mounting the high-frequency switch and the SAW filter on a printed circuit board is reduced and the duplexer can be made compact and lightweight. The cost of the duplexer can also be reduced.

The duplexer may further include at least one LC filter formed by a transmission line and a capacitor and built into the multi-layer substrate.

According to this duplexer, since the LC filter is also built into the multi-layer substrate and integrated, the dimensions of the duplexer are further reduced as compared with a conventional duplexer in which a discrete high-frequency switch and filter are mounted on a board and connected. Therefore, the duplexer can be made even more compact and lightweight.

Since the high-frequency switch and the filters can be designed at the same time, impedance matching of the high-frequency switch and the filters can easily be achieved. Therefore, a matching circuit becomes unnecessary, and the cost of the duplexer is reduced.

In the duplexer, a low-temperature-baked ceramic material may be used to form the multi-layer substrate. With a low-temperature-baked ceramic material, a plurality of dielectric layers and electrodes which form a transmission line and a capacitor on the plurality of the dielectric layers can be collectively baked. Therefore, the manufacturing process of the duplexer can be shortened and the cost thereof is reduced.

According to a duplexer of the present invention, since both a high-frequency switch and a filter are formed on a multi-layer substrate having a plurality of laminated, integrated dielectric layers, the overall dimensions become smaller than those of a conventional duplexer in which a discrete filter and a high-frequency switch are mounted on a board and connected. Also, since the filter and the high-frequency switch are designed at the same time, impedance matching for the filter and the high-frequency switch can easily be implemented.

DESCRIPTION OF EMBODIMENTS OF THE INVENTION

Figure 1:
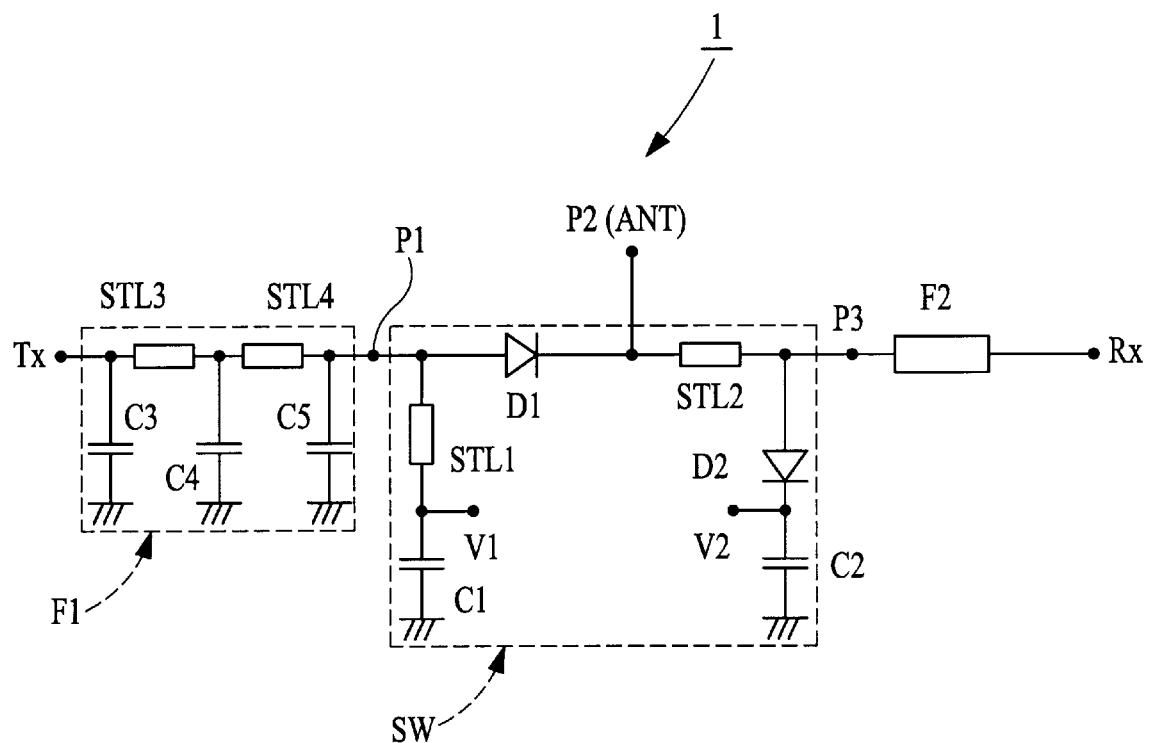
FIG. 1 is a circuit diagram of a duplexer according to an embodiment of the present invention.

Embodiments of the present invention will be described below by referring to the drawings.

FIG. 1 is a circuit diagram of a duplexer according to an embodiment of the present invention. A duplexer 1 is formed by a high-frequency switch SW, an LC filter F1 serving as a low-pass filter, and an SAW filter F2 serving as a band-pass filter.

The high-frequency switch SW is used for connecting either a transmission circuit Tx or a receiving circuit Rx to an antenna ANT in a mobile communication unit, typical of which are an automobile phone and a portable phone. The high-frequency switch SW is connected to the antenna ANT, to the LC filter F1, and to the SAW filter F2.

A first port P1 of the high-frequency switch SW, which connects the high-frequency switch SW to the LC filter F1, is connected to the anode of a diode D1. The anode of the diode D1 is grounded through a transmission line STL1 and a capacitor C1. The connection point between the transmission line STL1 and the capacitor C1 is connected to a control terminal V1. The cathode of the diode D1 is connected to a second port P2 which connects to an external electrode for the antenna.

The second port P2 is also connected to an end of a transmission line STL2. The other end of the transmission line STL2 is connected to a third port P3 which connects to the SAW filter F2, and is also grounded through a series circuit of a diode D2 and a capacitor C2. The connection point between the diode D2 and the capacitor C2 is connected to a control terminal V2.

The LC filter F1 is a Butterworth-type low-pass filter. Between the external transmitter electrode TX and the first port P1 of the high-frequency switch SW, transmission lines STL3 and STL4 are connected. The connection point between the transmission line STL3 and the external transmitter electrode Tx, the connection point between the transmission line STL3 and the transmission line STL4, and the connection point between the transmission line STL4 and the first port P1 of the high-frequency switch SW are grounded through capacitors C3, C4, and C5, respectively.

Figure 2:
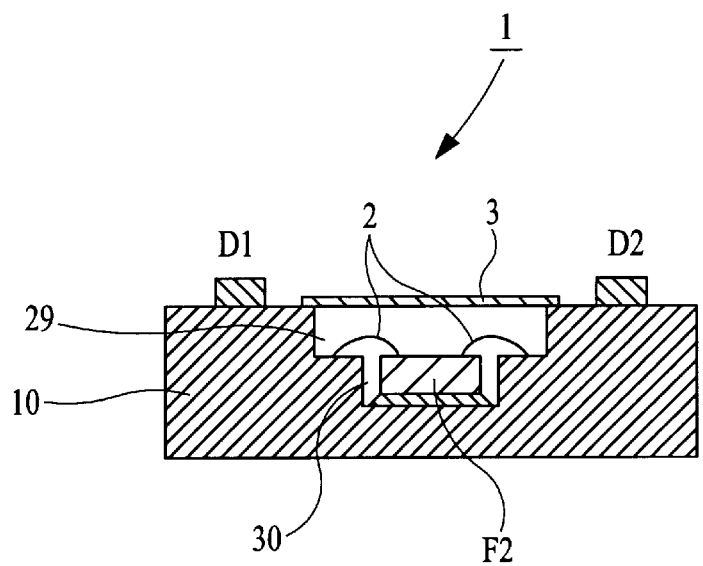
FIG. 2 is a cross-section of the duplexer shown in FIG. 1.
Figure 3:
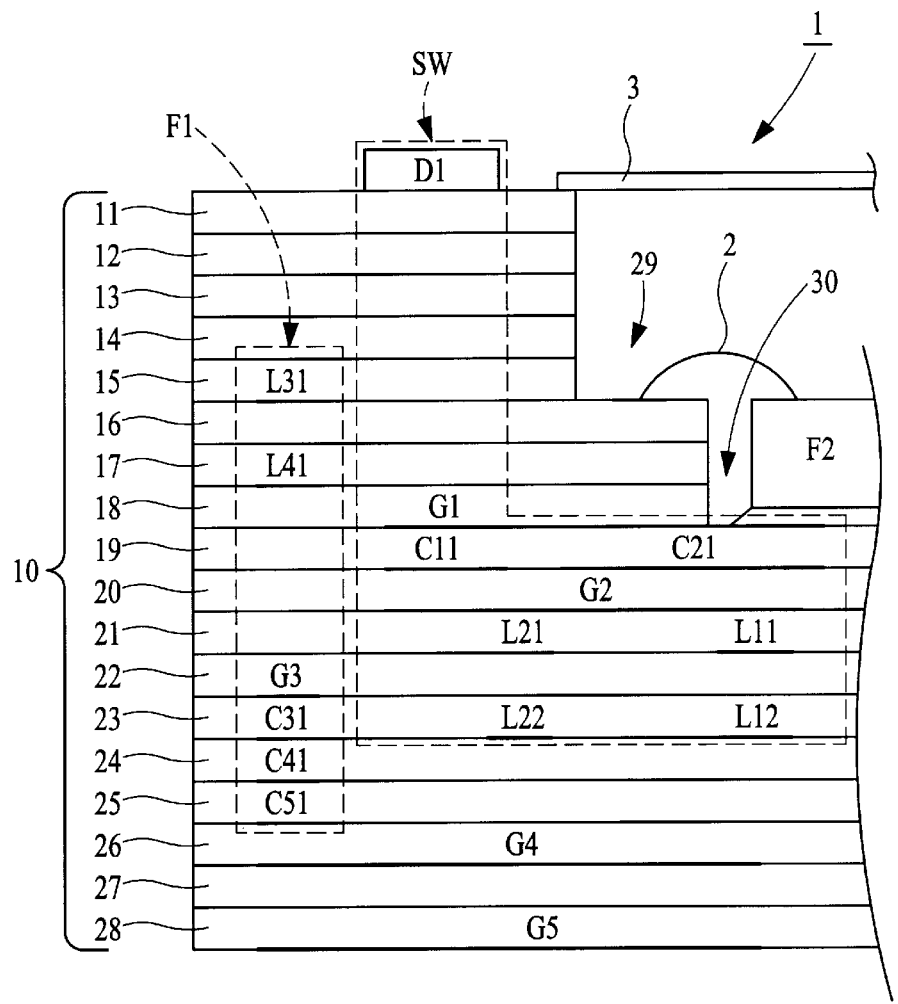
FIG. 3 is a detailed partial cross-section of the duplexer shown in FIG. 1.

FIG. 2 and FIG. 3 are a cross-section and a detailed partial cross-section of the duplexer 1 shown in FIG. 1. The duplexer 1 includes a multi-layer substrate 10 formed by a low-temperature-baked ceramic material which can be baked, for example, at a temperature of 850° C. to 1000° C. and which has barium oxide, aluminum oxide, and silica as main components. The multi-layer substrate 10 is formed by sequentially laminating first to 18th dielectric layers 11 to 28 from the top. A first cavity 29 is made at a position from the first dielectric layer 11 to the fifth dielectric layer 15, and a second cavity 30 is made at a position from the sixth dielectric layer 16 to the eighth dielectric layer 18. The SAW filter F2 is mounted by bonding wires 2 in the second cavity 30 and a metal cap 3 covers only the opening of the first cavity 29. The diodes D1 and D2 of the high-frequency SW are mounted on the first dielectric layer 11. Capacitor electrodes C11, C21, C31, C41, and C51 are formed on the tenth, 14th, 15th, and 16th dielectric layers 20, 24, 25, and 26.

Stripline electrodes L31, L41, L11, L21, L12, and L22 are formed on the sixth, eighth, 12th, and 14th dielectric layers 16, 18, 22, and 24. Ground electrodes G1 to G4 are formed on the ninth, 11th, 13th, and 17th dielectric layers, respectively. On the lower surface of the 18th dielectric layer 28, the external transmitter electrode, an external receiver electrode, the external electrode for the antenna, an external control electrode (not shown), and a ground electrode G5 are formed.

The capacitors C1 and C2 of the high-frequency switch SW are formed by the capacitor electrode C11 and the ground electrodes G1 and G2, and the capacitor electrodes C21 and the ground electrodes G1 and G2, respectively. The capacitors C3, C4, and C5 of the LC filter F1 are formed by the capacitor electrodes C31, C41, and C51 and the ground electrodes G3 and G4, respectively.

The transmission lines STL1 and STL2 of the high-frequency switch SW are formed by the stripline electrodes L11 and L12, and the stripline electrodes L21 and L22, respectively. The transmission lines STL3 and STL4 are formed by the stripline electrodes L31 and L41, respectively.

With the structure described above, the duplexer 1 having the circuit shown in FIG. 1 is configured on one multi-layer substrate.

As described above, according to the duplexer of the first embodiment, since the SAW filter is mounted on the multi-layer substrate formed by laminating a plurality of dielectric layers constituting the high-frequency switch, and the LC filter is built into the substrate and integrated, the area required for mounting the high-frequency switch, the LC filter and the SAW filter on a printed circuit board can be reduced and the duplexer can be made compact and lightweight as compared with a conventional duplexer in which a discrete high-frequency switch and filter are mounted on a board and connected. The cost of the duplexer can also be reduced.

Since the high-frequency switch and the filter can be designed at the same time, impedance matching of the high-frequency switch and the filter is easily achieved. A matching circuit is not required and the cost is reduced.

Since a low-temperature-baked ceramic material is used for the multi-layer substrate, a plurality of dielectric layers and electrodes on the plurality of dielectric layers for forming transmission lines and capacitors can be collectively baked. Therefore, the manufacturing process is made short and the cost is also reduced.

The duplexer can be made even more compact and lightweight since the SAW filter is mounted in a cavity of the multi-layer substrate and the metal cap covers only the opening of the cavity.

Figure 4:
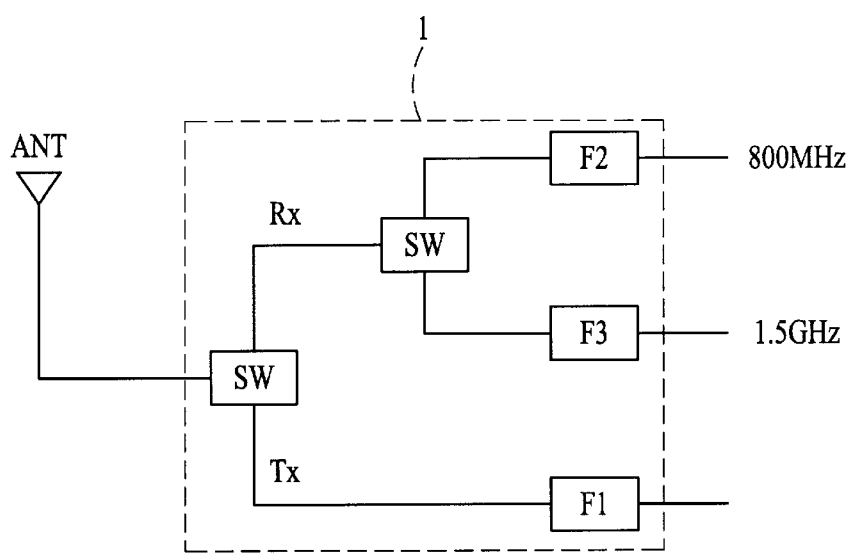
FIG. 4 is a block diagram of a duplexer according to another embodiment of the present invention.
Figure 5:
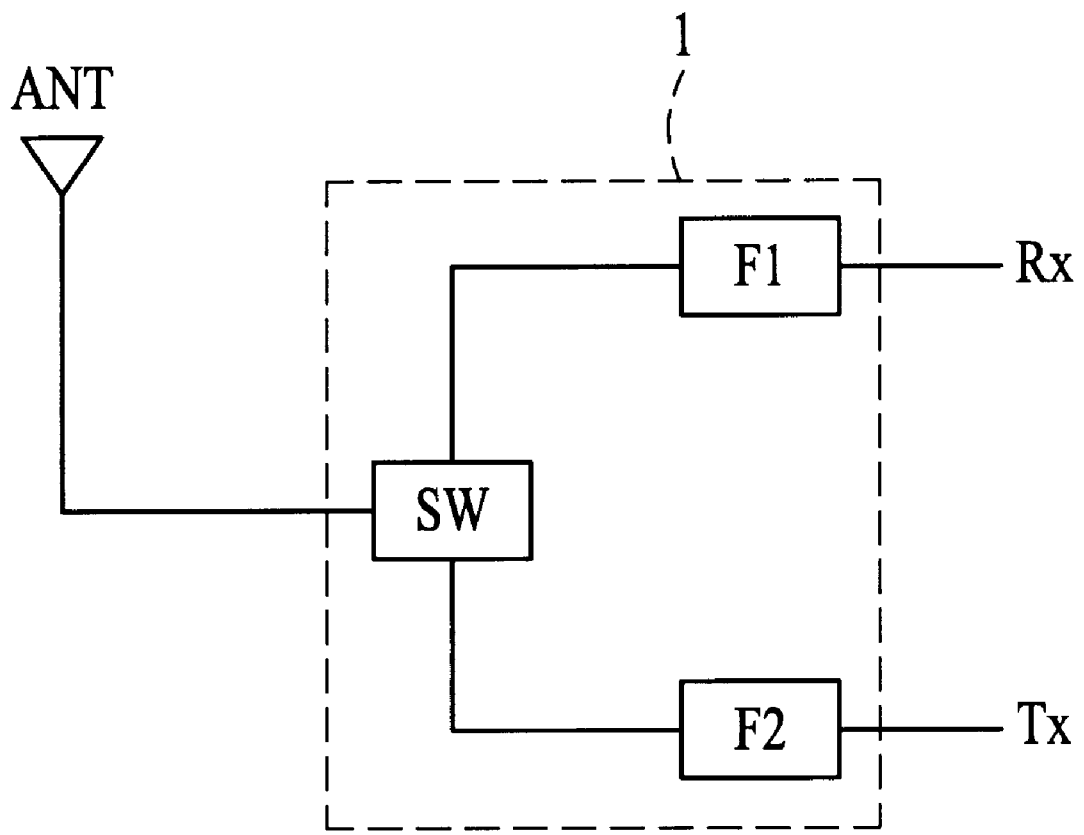
FIG. 5 is a block diagram showing the general components of a duplexer.

In the above embodiment, the duplexer includes only one high-frequency switch, one SAW filter, and one LC filter. However, the duplexer may include a plurality of high-frequency switches, SAW filters, and LC filters. For example, as shown in FIG. 4, one high-frequency switch SW and two SAW filters F2 and F3 serving as band-pass filters having different pass bands may be provided at a receiving circuit Rx. In this case, for example, when the SAW filter F2 has a pass band of 800 MHz and the SAW filter F3 has a pass band of 1.5 GHz, radio waves from two systems, a personal digital cellular 800 (PDC 800) using an 800 MHz signal and a PDC 1500 using a 1500 MHz signal, can both be received.

The circuit diagram and the detailed partial side view of the high-frequency switch shown in FIG. 1 and FIG. 3 show one example. However, any high-frequency switch formed by a diode mounted on a multi-layer substrate, and a transmission line and a capacitor built into the multi-layer substrate, can be within the scope of this invention.

The circuit diagram of the LC filter shown in FIG. 1 shows one example. However, any LC filter formed by a transmission line and a capacitor built into a multi-layer substrate can be within the scope of the present invention.

In the above embodiment, the SAW filter is a band-pass filter and the LC filter is a low-pass filter. However, they may both be band-pass filters, for example.

In the above embodiment, the SAW filter is mounted in a cavity of the multi-layer substrate. However, the SAW filter may be mounted on a surface of the multi-layer substrate.

In the above embodiment, the transmission lines STL1 to STL4 are formed by striplines. They may be formed by microstriplines or coplanar guide lines as well.

In the above embodiment, the low-temperature-baked ceramic substrate is made from a material having barium oxide, aluminum oxide, and silica as main components. Other materials, such as a material having barium oxide, silica, strontium oxide, and zirconium oxide as main components or a material having calcium zirconium oxide and glass as main components may be used as well.

What is claimed is:

1. A duplexer comprising:
    a multi-layer substrate comprising a plurality of laminated, cofired dielectric layers;
    at least one high-frequency switch comprising a diode mounted on said multi-layer substrate and a transmission line and a capacitor within said multi-layer substrate, said transmission line and said capacitor each being formed by respective conductors on a plurality of said layers; and at least one SAW filter disposed on said multi-layer substrate;

wherein said high-frequency switch and said SAW filter are interconnected by conductors on respective layers within said multi-layer substrate.

2. A duplexer according to claim 1, wherein said dielectric layers and said multi-layer substrate comprise a low-temperature-baked ceramic material.

3. A duplexer according to claim 1, wherein said at least one SAW filter is disposed in a cavity of said multi-layer substrate.

4. A duplexer according to claim 1, further comprising at least one additional filter connected to said high-frequency switch by conductors on respective layers within said multilayer substrate.

5. A duplexer according to claim 4, wherein said at least one additional filter comprises a SAW filter.

6. A duplexer comprising:

a multi-layer substrate comprising a plurality of laminated, cofired dielectric layers;

at least one high-frequency switch comprising a diode mounted on said multi-layer substrate and a transmission line and a capacitor within said multi-layer substrate, said transmission line and said capacitor each being formed by respective conductors on a plurality of said layers;

at least one SAW filter disposed on said multi-layer substrate; and at least one LC filter comprising a transmission line and a capacitor each formed by respective conductors on a plurality of layers within said multi-layer substrate;

wherein said LC filter, said high-frequency switch and said SAW filter are interconnected by conductors on respective layers within said multilayer substrate.

7. A duplexer according to claim 6, wherein said dielectric layers and said multi-layer substrate comprise a low-temperature-baked ceramic material.

8. A duplexer according to claim 6, further comprising an antenna terminal connected to both said SAW filter and said LC filter, for feeding a signal to an antenna from one of said SAW filter and said LC filters, and for feeding a signal from an antenna to the other of said SAW filter and said LC filter.

9. A duplexer according to claim 6, further comprising at least one additional filter connected to said high-frequency switch by conductors on respective layers within said multilayer substrate.

10. A duplexer according to claim 9, wherein said at least one additional filter comprises a SAW filter.

11. A duplexer according to claim 6, wherein said at least one SAW filter is disposed in a cavity of said multi-layer substrate.

* * * * *